US010650888B1

(12) United States Patent
Raad et al.

(10) Patent No.: US 10,650,888 B1
(45) Date of Patent: May 12, 2020

(54) TUNING VOLTAGES IN A READ CIRCUIT

(71) Applicant: Micron Technology, Inc., Boise, ID (US)

(72) Inventors: George B. Raad, Boise, ID (US); John F. Schreck, Lucas, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/232,359

(22) Filed: Dec. 26, 2018

(51) Int. Cl.
*G11C 11/00* (2006.01)
*G11C 11/56* (2006.01)

(52) U.S. Cl.
CPC ........ *G11C 11/565* (2013.01); *G11C 11/5657* (2013.01); *G11C 2211/5634* (2013.01)

(58) Field of Classification Search
CPC . G11C 16/0483; G11C 16/10; G11C 11/4096; G11C 16/26; G11C 11/4093; G11C 13/0069; G11C 16/08; G11C 5/02; G11C 11/406; G11C 13/00; G11C 13/0002; G11C 16/24; G11C 7/1051; G11C 16/0408
See application file for complete search history.

(56) References Cited

U.S. PATENT DOCUMENTS

| 9,202,531 | B2* | 12/2015 | Seo | G11C 7/065 |
| 9,773,544 | B2* | 9/2017 | Woo | G11C 11/4094 |
| 2010/0226192 | A1* | 9/2010 | Moon | G11C 7/1048 365/203 |
| 2010/0277997 | A1* | 11/2010 | Kim | G11C 7/08 365/207 |
| 2019/0325941 | A1* | 10/2019 | Guo | G11C 16/26 |

* cited by examiner

*Primary Examiner* — Hien N Nguyen
(74) *Attorney, Agent, or Firm* — Holland & Hart LLP

(57) ABSTRACT

Techniques are provided for tuning the voltages of a circuit for reading a memory cell capable of storing three or more logic states. To read the memory cell, a charge may be transferred between a digit line and a sense component using a charge transfer device. The gate of the charge transfer device may initially be biased to a first voltage and subsequently tuned to a second voltage to optimize the sense window. After biasing the gate of the charge transfer device to the second voltage, the memory cell may discharge its charge onto the digit line, which may result in the digit line being biased to a third voltage. Based on whether the third voltage exceeds the second voltage, the charge transfer device may transfer the charge associated with the memory cell.

25 Claims, 7 Drawing Sheets

TUNING VOLTAGES IN A READ CIRCUIT

BACKGROUND

The following relates generally to a system that includes at least one memory device and more specifically to tuning voltages in a read circuit.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Volatile memory devices, e.g., DRAM, may lose their stored state over time unless they are periodically refreshed by an external power source.

Improving memory devices, generally, may include increasing memory cell density, increasing read/write speeds, increasing reliability, increasing data retention, reducing power consumption, or reducing manufacturing costs, among other metrics. Some memory cells may be configured to store multiple states. Sensing such a memory cell may be desired to more accurately sense the state stored to the memory cell and increase reliability during a read operation, among other benefits.

DETAILED DESCRIPTION

Figure 1:
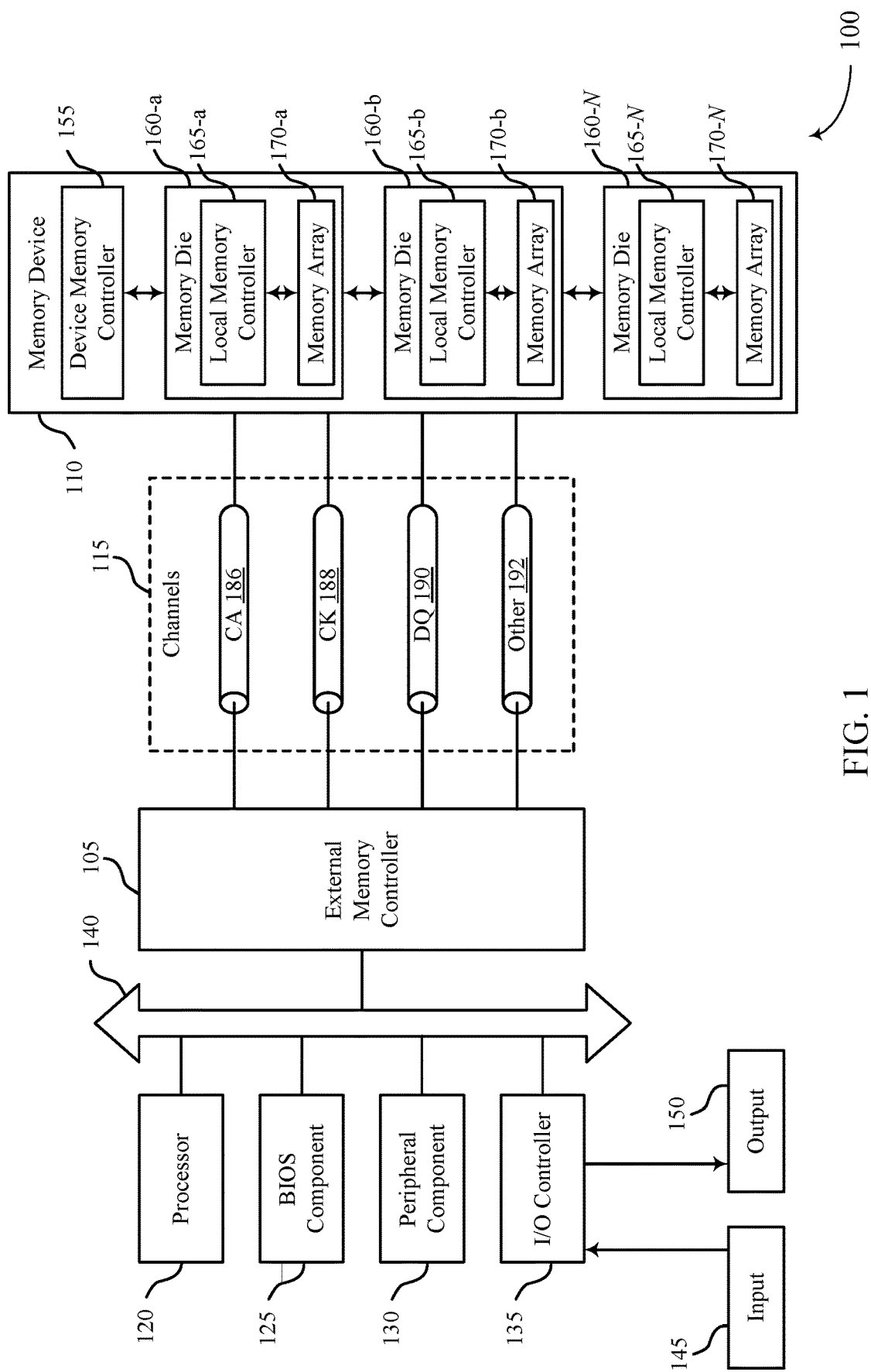
FIG. 1 illustrates an example of a system for transferring a charge between a digit line and a sense component that supports tuning voltages in a read circuit in accordance with aspects of the present disclosure.

Sensing a memory cell (e.g., a binary memory cell capable of storing two states, a multi-level memory cell capable of storing multiple states) may be improved by implementing a capacitor for tuning the voltage at a gate of a charge transfer device. As such, a single memory cell may be configured to store more than one bit of digital data. To sense a memory cell, a charge transfer device may be used to improve the window in which the memory cell is sensed by amplifying the differences between charges stored on a memory cell to more accurately sense the particular logic state stored on the memory cell. Thus, based on the particular logic state stored to the memory cell, the charge transfer device may couple a digit line associated with the memory cell to a sense component during a read operation. The charge transfer device may have a threshold voltage. The voltage applied to the gate of the charge transfer device may compensate for the threshold voltage of the charge transfer device. The capacitor coupled to the gate of the charge transfer device and a voltage source may tune the voltage applied to the gate of the charge transfer device. The ability to tune the voltage applied to the gate of the charge transfer device may enable a more optimized sense window.

Techniques are described for tuning voltages in a read circuit. A charge transfer device may be used to transfer the charge between the digit line and the sense component. A circuit for sensing a memory cell may include the charge transfer device (e.g., a first transistor), a capacitor configured to tune the gate voltage of the charge transfer device, a compensation device (e.g., a second transistor) configured to apply a gate voltage to the gate of the charge transfer device, and a sense component. The capacitor may be coupled with a gate of the charge transfer device.

To transfer the charge between the digit line and the sense component during a read operation, the gate of the charge transfer device may be biased to a first voltage. The first voltage applied to the gate of the charge transfer device may be such that, when applied, the charge transfer device transfers different amounts of charge based on the state stored on the memory cell. A first voltage may initially be applied to the gate of the charge transfer device using at least in part the compensation device. After the compensation device is deactivated, the value of the first voltage may be tuned by increasing or decreasing a voltage applied to the capacitor coupled to the gate of the charge transfer device. For example, increasing the voltage applied to the capacitor may cause an increase of the gate voltage while decreasing the voltage applied to the capacitor may cause a decrease of the gate voltage. The memory cell may be discharged onto the digit line to bias the digit line to a second voltage. Accordingly, when the first voltage exceeds (e.g., is greater than) the second voltage, the charge transfer device may couple the digit line to the sense component and transfer the charge between the digit line and the sense component. Thus, a charge may be transferred from a memory cell to a sense component based on a value of the logic state stored to the memory cell.

Features of the disclosure are initially described in the context of a memory system. Features of the disclosure are described in the context of a memory die, a memory system, and a timing diagram that support tuning voltages in a read circuit in accordance with aspects of the present disclosure. These and other features of the disclosure are further illustrated by and described with reference to an apparatus diagram and flowcharts that relate to sensing techniques using a charge transfer device.

FIG. 1 illustrates an example of a system 100 that utilizes one or more memory devices in accordance with aspects disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 125 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots. The peripheral component(s) 125 may be other components understood by those skilled in the art as peripherals.

The I/O controller 135 may manage data communication between the processor 120 and the peripheral component(s) 13, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, etc. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein. In some examples, a memory device 110 or a memory die 160 may be coupled with or include one or more sense components. Each memory cell, for example, may be coupled with a sense component via a digit line coupled with a charge transfer device (e.g., a transistor). The gate of the charge transfer device may be coupled with a compensation device (e.g., a second transistor) configured to apply a voltage to a gate of the charge transfer device. In some instances, the capacitor may be configured to make tuning adjustments to the gate voltage applied to the gate of the charge transfer device to enable a more optimized sense window. In some examples, the charge transfer device may be configured to transfer a charge between the digit line and the sense component based on a memory cell being discharged onto the digit line.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2. The memory device 110 may be coupled with one or more sense components. For example, each memory cell (e.g., of a respective memory array) may be coupled with a sense component via digit line and a charge transfer device (e.g., a transistor). In some examples, the gate of each transistor may be coupled with a compensation device (e.g., a second transistor) and a capacitor configured to tune the gate voltage of the charge transfer device.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any number of memory dice 160-N). In a 3D memory device, a plurality of memory dice 160-N may be stacked on top of one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the number of memory cells that may be positioned on a substrate as compared with a single 2D memory device, which in turn may reduce production costs or increase the performance of the memory array, or both.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like. In some examples, the device memory controller 155 may be configured to control the operations of a memory array as it relates to a charge transfer operation. For example each memory cell of memory array 170-a may be coupled with a sense component via a respective digit line. In some examples, the digit line may be coupled with a charge transfer device configured to transfer a charge between the digit line and the sense component based on a memory cell being discharged onto the digit line.

For the charge to be transferred, the local memory controller 165 may bias a gate of the first transistor (e.g., of the charge transfer device) to a first voltage. The local memory controller 165 may adjust the first voltage (e.g., tune the first voltage) by changing the voltage applied across the capacitor coupled to the gate of the charge transfer device. The first voltage may represent a voltage that allows the first transistor to remain activated (e.g., turned on). In some examples, the local memory controller 165 may then bias the digit line to a second voltage by discharging the memory cell onto the digit line. Accordingly, the local memory controller 165 may cause a charge to be transferred, by the first transistor (e.g., by the charge transfer device), between the digit line and the sense component based on the first voltage being greater than the second voltage of the digit line. Stated another way, the local memory controller 165 may cause the charge to be transferred to the sense component based on a logic state stored to the memory cell and a respective charge discharged onto the digit line.

In other examples, for the charge to be transferred, the local memory controller 165 may bias a gate of the first transistor (e.g., of the charge transfer device) to a first voltage. As described above, the first voltage may represent a voltage that allows the first transistor to be variably activated (e.g., turned on) based on a stated stored in a memory cell. In some examples, the local memory controller 165 may apply a second voltage from a voltage source to a node of the first transistor while the node of the first transistor is isolated from the digit line. The second voltage may be applied from a voltage source coupled with the digit line. The local memory controller 165 may cause the memory cell to discharge onto the digit line concurrent with biasing the gate of the first transistor, which may result in the digit line being biased to a third voltage. Subsequently, the local memory controller may isolate the voltage source from the digit line and couple the digit line with the node of the first transistor. In some examples, the local memory controller 165 may cause the charge to be transferred, by the first transistor, between the digit line and the sense component based on the third voltage being less than the first voltage of the gate of the first transistor.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be ×4 (e.g., including four signal paths), ×8 (e.g., including eight signal paths), ×16 (including sixteen signal paths), etc.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include eight or nine signal paths.

In some cases, the channels 115 may include one or more clock signal (CK) channels 188. The CK channels 188 may be configured to communicate one or more common clock signals between the external memory controller 105 and the memory device 110. Each clock signal may be configured oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. In some cases, the clock signal may be a 1.5 GHz signal. A CK channel 188 may include any number of signal paths. In some cases, the clock signal CK (e.g., a CK_t signal and a CK_c signal) may provide a timing reference for command and addressing operations for the memory device 110, or other system-wide operations for the memory device 110. The clock signal CK may therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110. The data channels 190 may communicate signals that may be modulated using a variety of different modulation schemes (e.g., NRZ, PAM4).

In some cases, the channels 115 may include one or more other channels 192 that may be dedicated to other purposes. These other channels 192 may include any number of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any number of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any number of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM8, etc., quadrature amplitude modulation (QAM), quadrature phase shift keying (QPSK), and/or others. A multi-symbol signal or a PAM4 signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols. As indicated herein and described with reference to FIGS. 3 and 4, the sensing scheme described may be performed with respect to multi-level memory cells. Additionally or alternatively, the sensing scheme described may be performed with respect to binary memory cells.

Figure 2:
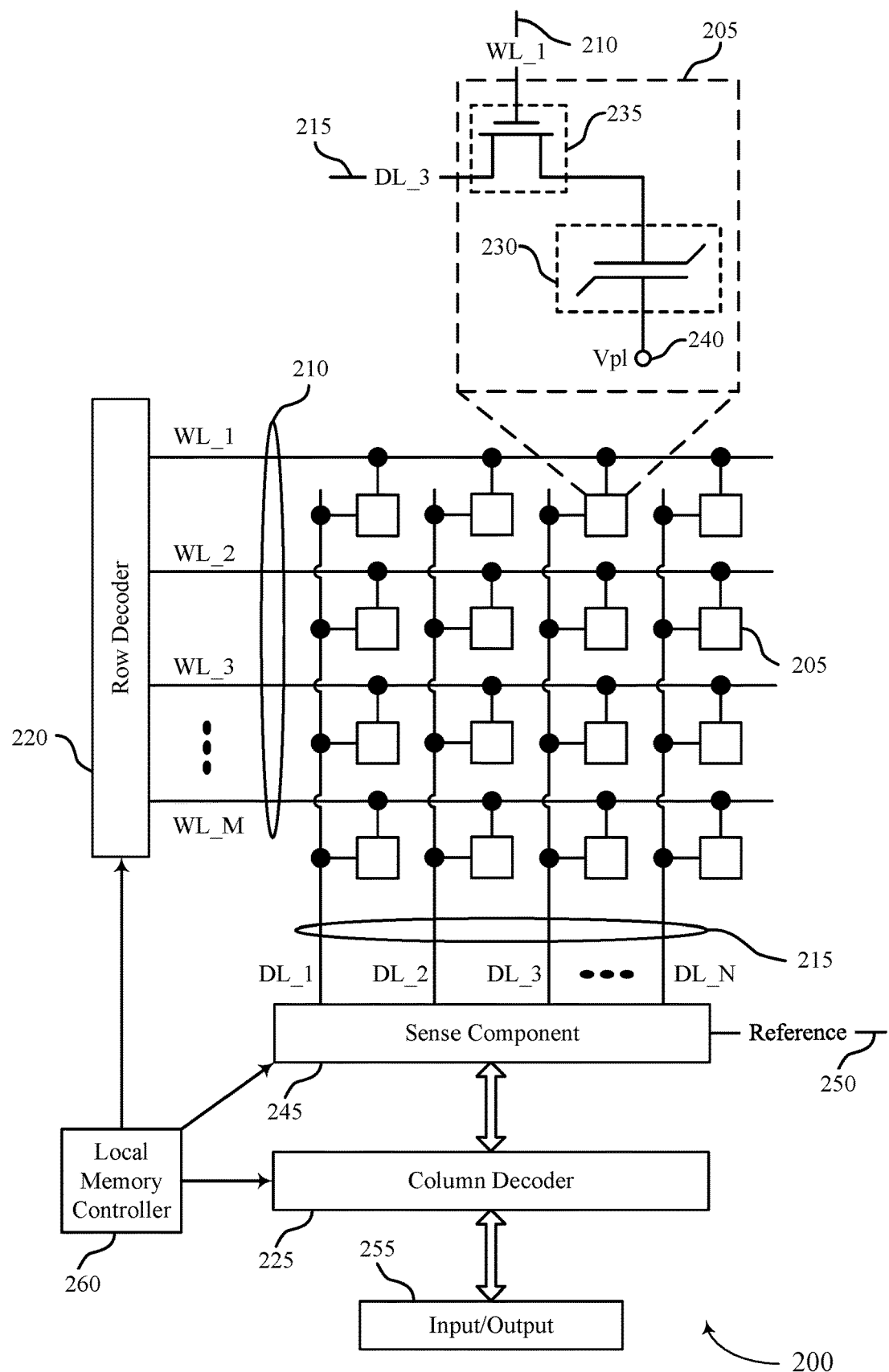
FIG. 2 illustrates an example of a memory die that supports tuning voltages in a read circuit in accordance with aspects of the present disclosure.

FIG. 2 illustrates an example of a memory die 200 that supports tuning voltages in a read circuit in accordance with aspects of the present disclosure. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time. For example, the memory cell 205 may be configured to store three bits of digital logic (e.g., a logic 00, a logic "mid" either 01 or 10, or a logic 11) or four bits of digital logic (e.g., a logic 00, logic 01, logic 10, or a logic 11).

A memory cell 205 may store a charge representative of the programmable states in a capacitor. DRAM architectures may include a capacitor that includes a dielectric material to store a charge representative of the programmable state. In some examples, the memory cell 205 may be coupled with sense component 245 via digit line 215. In some examples, the digit line may be coupled with a charge transfer device configured to transfer charge between the digit line and the node of the sense component during a read operation. The charge transfer device may be configured to improve sensing capabilities of memory cell 205 (e.g., of a multi-level memory cell configured to store three or more logic states).

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220, a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory die 200 may include multiple word lines 210, labeled WL_1 through WL_M, and multiple digit lines 215, labeled DL_1 through DL_N, where M and N depend on the size of the memory array. Thus, by activating a word line 210 and a digit line 215, e.g., WL_1 and DL_3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 may be the cell plate reference voltage, such as Vpl. In some cases, the voltage source 240 may be an example of a plate line coupled with a plate line driver. The switching component 235 may be an example of a transistor or any other type of switch device that selectively establishes or de-establishes electronic communication between two components. In some examples, memory cell 205 may be or may be referred to as a binary memory cell. Stated another way, memory cell 205 may be configured to store two states (e.g., a logic '0' or a logic '1'). In some other examples, memory cell 205 may be or may be referred to as a multi-level memory cell. Stated another way, memory cell 205 may be configured to store three or more states (e.g., three or more logic states).

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 is a transistor and its operation may be controlled by applying a voltage to the transistor gate, where the voltage differential between the transistor gate and transistor source may be greater or less than a threshold voltage of the transistor. In some cases, the switching component 235 may be a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215. As described above, the digit line 215 may be coupled with a charge transfer device (e.g., a transistor), which may be coupled with a sense component 245. In some examples, the digit line 215 may be configured to receive a charge from (e.g., to be biased by) memory cell 205. Stated another way, memory cell 205 may be discharged onto digit line 215, which may bias the digit line to a particular voltage. The voltage of the digit line may thus be representative of or related to a logic state stored to memory cell 205. For example, if memory cell 205 were to store a logic "0" and be discharged onto digit line 215, the digit line may be biased to a different voltage than if memory cell 205 were to store a logic "1" and be discharged onto digit line 215. In some examples, the charge transfer device may transfer the voltage discharged onto the digit line 215 to a sense component 245 based on the voltage of the digit line and the voltage of its gate.

The sense component 245 may be configured to detect state (e.g., a charge) stored on the capacitor 230 of the memory cell 205 and determine a logic state of the memory cell 205 based on the stored state. The charge stored by a memory cell 205 may be extremely small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge.

During a read operation, the capacitor 230 of memory cell 205 may output a signal (e.g., discharge a charge) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0.

The sense component 245 may include various transistors or amplifiers to detect and amplify a difference in the signals. The detected logic state of memory cell 205 may be output through column decoder 225 as output 255. In some cases, the sense component 245 may be part of another component (e.g., a column decoder 225, row decoder 220). In some cases, the sense component 245 may be in electronic communication with the row decoder 220 or the column decoder 225. In some examples, sense component 245 may be configured to receive a charge from a charge transfer device coupled with digit line 215. As described above, memory cell 205 may be discharged onto digit line 215 and, in some examples, the charge transfer device may transfer the resulting charge to sense component 245. The charge transfer device may, in some examples, improve a quality of the signal (e.g., of the charge) transferred to the sense component 245, such that the sense component 245 may operate with greater accuracy. The sense component 245 may operate with greater accuracy particularly as it relates to multi-level memory cells.

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, one or more of the row decoder 220, column decoder 225, and sense component 245 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current discussed herein may be adjusted or varied and may be different for the various operations discussed in operating the memory die 200.

As described above with reference to FIG. 1, local memory controller 260 may facilitate the transfer of a charge from memory cell 205 to sense component 245. For the charge to be transferred, the local memory controller 260 may bias a gate of the first transistor (e.g., of the charge transfer device) to a first voltage. The first voltage may represent a voltage that allows the first transistor to remain activated (e.g., turned on). Local memory controller 260 may adjust (e.g., tune) the voltage applied to the gate of the first transistor. In some examples, the local memory controller 260 may determine that the first voltage may be higher or lower than the voltage initially applied to the first transistor. The local memory control may adjust a bias voltage applied to a plate of a capacitor coupled to the gate of the first transistor thus causing a corresponding adjust of the gate voltage of the first transistor. In some examples, the local memory controller 260 may then bias the digit line to a second voltage by discharging the memory cell onto the digit line. Accordingly, the local memory controller 260 may cause a charge to be transferred, using the first transistor (e.g., by the charge transfer device), between the digit line and the sense component based on the first voltage being greater than the second voltage of the digit line. Stated another way, the local memory controller 260 may cause the charge to be transferred to the sense component based on a logic state stored to the memory cell and a respective charge discharged onto the digit line.

In other examples, for the charge to be transferred, the local memory controller 260 may bias a gate of the first transistor (e.g., of the charge transfer device) to a first voltage. As described above, the first voltage may represent a voltage that allows the first transistor to be variably activated based on the state stored on the memory cell. In some examples, the local memory controller 260 may then apply a second voltage from a voltage source to a node of the first transistor while the node of the first transistor is isolated from the digit line. The second voltage may be applied from a voltage source coupled with the digit line. The local memory controller 260 may discharge a memory cell onto the digit line concurrent with biasing the gate of the first transistor, which may result in the digit line being biased to a third voltage. Subsequently, the local memory controller 260 may isolate the voltage source from the digit line. After isolating the voltage source from the digit line, the local memory controller 260 may adjust the voltage applied to a capacitor coupled to the gate of the first transistor from a first voltage to a second voltage. The difference between the first and second voltage applied to the capacitor may cause a corresponding adjust of the gate voltage of the first transistor. The local memory controller 260 may couple the digit line with the node of the first transistor. In some examples, the local memory controller 260 may cause the charge to be transferred, by the first transistor, between the digit line and the sense component based on the third voltage being less than the first voltage of the gate of the first transistor.

In some cases, the local memory controller 260 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state.

In some cases, the local memory controller 260 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The target memory cell 205 may transfer a signal to the sense component 245 in response to biasing the access lines. The sense component 245 may amplify the signal. The local memory controller 260 may activate the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation.

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

Figure 3:
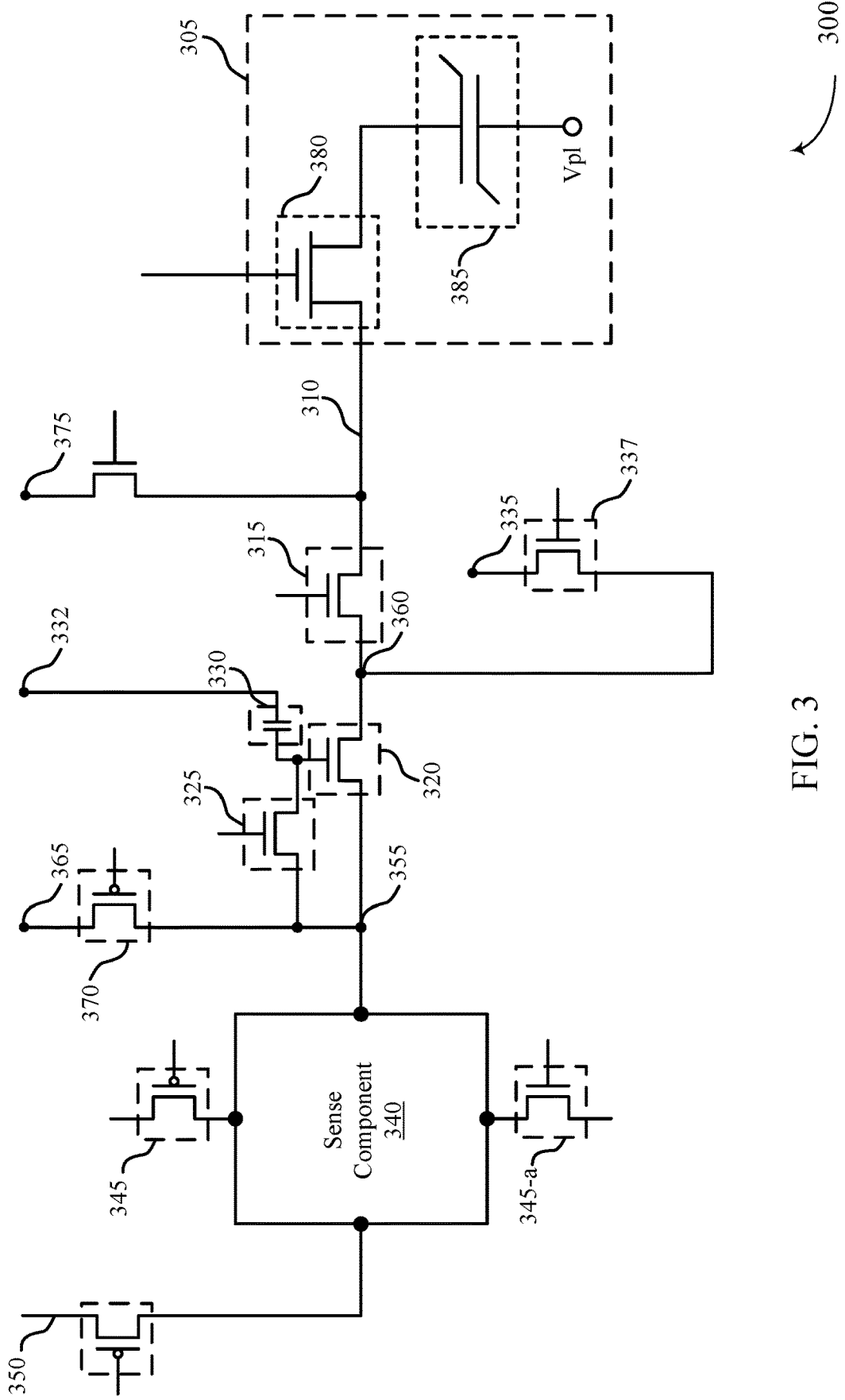
FIG. 3 illustrates an example of a circuit that supports tuning voltages in a read circuit in accordance with aspects of the present disclosure.

FIG. 3 illustrates an example of a circuit 300 that supports tuning voltages in a read circuit in accordance with aspects of the present disclosure. In some examples, circuit 300 may include one or more components described above with reference to FIGS. 1 and 2. For example, circuit 300 may include memory cell 305, which may be an example of memory cell 205 as described with reference to FIG. 2; digit line 310, which may be an example of digit line 215 as described with reference to FIG. 2; and sense component 340, which may be an example of sense component 245 as described with reference to FIG. 2. In some examples, circuit 300 may include isolation device 315, charge transfer device 320, compensation device 325, capacitor 330, voltage source 335, transistor 337, transistor 345 and transistor 345-a, and reference line 350. Circuit 300 may include node 355, node 360, a voltage source (e.g., a CT precharge voltage) 365, a transistor 370, and a voltage source (e.g., DVC2) 375, and a transistor 377. In some examples, the memory cell 305 may include a transistor (e.g., a switching component) 380, and a capacitor 385. In some examples, the charge transfer device 320 may be referred to as a first transistor, the compensation device 325 may be referred to as a second transistor, and the isolation device 315 may be referred to as a third transistor.

In some examples, memory cell 305 may be indirectly coupled with sense component 340. For example, memory cell 305 may be coupled with digit line 310, which may be coupled with isolation device 315, which may be coupled with charge transfer device 320, which may be coupled with sense component 340. In some examples, as described above, memory cell 305 may be discharged onto digit line 310. The resulting voltage or charge on the digit line 310 may be transferred to sense component 340 via charge transfer device 320 and/or the isolation device 315. The transfer may occur, in part, based on a voltage applied to the gate of charge transfer device 320 and/or whether isolation device 315 is active (or inactive). In some examples, sense component 340 may be coupled with one or more voltage sources through transistor 345 and transistor 345-a, and may compare the transferred charge (e.g., a voltage on node 355) to a reference line 350. In some examples, transistor 345 and transistor 345-a may be implemented to prevent sense component 340 from being activated inadvertently (e.g., turning on before a read operation occurs) during the read operation. For example, components or transistors of the sense component 340 may be become activated while the node 355 is being precharged. Using the transistor 345 and the transistor 345-a, greater precharge voltages may be applied to the node 355.

The charge transfer device 320 may be coupled with isolation device 315, compensation device 325, capacitor 330, and sense component 340. The charge transfer device 320 may be, in some examples, a transistor (e.g., a first transistor). Accordingly, a gate of the charge transfer device 320 may be coupled with the compensation device 325 and the capacitor 330. A source of the charge transfer device 320 may be coupled with isolation device 315 (e.g., which is coupled with memory cell 305). A drain of the charge transfer device 320 may be coupled with sense component 340. In some examples, the drain of the charge transfer device 320 may be coupled with node 355. The charge transfer device 320 may be configured to transfer a charge (e.g., a charge received at its source) based on a voltage of the digit line 310 being less than a voltage applied to the gate of the charge transfer device 320. With the charge transfer device 320 being activated, the device may transfer any charge to the sense component 340 such that a voltage at its source is less than the voltage of the gate (e.g., so that the device remains activated).

As described above, the compensation device 325 and capacitor 330 may be coupled with the gate of the charge transfer device 320. In some examples, a precharge voltage may be applied to node 355 as part of applying the first voltage to the gate of the charge transfer device 320. When the compensation device 325 is activated, applying the precharge voltage to the node 355 may also be applied to the gate of the charge transfer device 320.

The compensation device 325 may be configured to apply a voltage to the gate of the charge transfer device 320 that compensates for a threshold voltage of the charge transfer device 320. A memory device may include multiple charge transfer devices. Because each charge transfer device may have a unique threshold voltage, implementing at least one compensation device 325 for each charge transfer device may allow for uniformity of the read operation across different digit lines. As part of biasing the gate of the charge transfer device 320 to the first voltage, the voltage applied to node 355 may be removed and the isolation device 315 may be activated. In such cases, node 355 may be coupled to a voltage higher (e.g., slightly higher) than the precharged digit line 310. The voltage on the node 355 may relax to a voltage that is the precharge value of the digit line 310 plus the threshold voltage of the charge transfer device 320. After the first voltage is set, the compensation device 325 may be deactivated and the gate of the charge transfer device 320 may be caused to float.

The gate of the charge transfer device 320 and the voltage source 332 may be coupled with the capacitor 330. For example, a first plate of the capacitor 330 may be coupled with the voltage source 332 and a second plate of the capacitor 330 may be coupled with the charge transfer device 320. After the deactivation of compensation device 325, the capacitor 330 may be used to adjust (e.g., tune) the voltage at the gate of the charge transfer device 320. Tuning the voltage at the gate of the charge transfer device 320 may enable a more optimized sense window. In some instances, the voltage of the gate of the charge transfer device 320 may not be at a proper voltage set point after a compensation period (e.g., after compensation device 325 may be deactivated). The ability to tune the voltage of the gate of the charge transfer device 320 may enable a proper voltage set point to optimize the sense window.

The voltage at the gate of the charge transfer device 320 may be identified. If the identified voltage is different than the threshold voltage of the charge transfer device 320 or if it satisfies a threshold, the capacitor 330 may be configured to tune the voltage at the gate of the charge transfer device 320. For example, the compensation device 325 may be deactivated before the voltage on the node 355 has relaxed to a value of the threshold voltage associated with the charge transfer device 320. The capacitor 330 may be configured to further decrease the voltage at the gate of the charge transfer device 320, thus accounting for the threshold voltage associated with the charge transfer device 320. In another example, characteristics of the charge transfer device 320 may vary between charge transfer devices 320 (e.g., depending on a manufacturing batch or depending on a manufacturing fabrication plant). The capacitor 330 may be configured to tune the voltage at the gate of the charge transfer device 320 to account for such changes (e.g., the capacitor 330 may be configured to increase the voltage at the gate of the charge transfer device 320 to account for a threshold voltage increase).

Voltage source 332 may be configured to adjust the voltage applied to the capacitor 330 such that a corresponding adjust in voltage may be applied to the gate of the charge transfer device 320. Capacitor 330 may include a first plate coupled to the voltage source 332 and a second plate coupled to the gate of the charge transfer device 320. Voltage source 332 may bias the capacitor 330 from a first voltage to a second voltage, where the voltage applied to the gate of the charge transfer device 320 may be based on the difference between the first and second voltage. In some cases, a memory device may include multiple charge transfer devices where the voltage source 332 may be coupled with the multiple charge transfer devices. Thus, when the voltage source 332 adjusts it may adjust the voltage applied to the gates of multiple charge transfer devices 320. Additionally or alternatively, capacitor 330 may be implemented to maintain the gate of the charge transfer device 320 at a fixed voltage (e.g., at a first voltage).

After the first voltage is applied to the gate of the charge transfer device 320, the isolation device 315 may be deactivated and the charge transfer device 320 may be isolated from the digit line 310. After this, the memory cell 305 may be discharged onto the digit line 310, which may bias the digit line 310 to a particular voltage level based on the state stored on the memory cell 305. When the isolation device 315 is reactivated, the voltage of the digit line 310 (e.g., due to the memory cell 305 being discharged) may be received at the charge transfer device 320 (e.g., at the source of charge transfer device 320). In some examples, isolation device 315 may be deactivated after discharging the memory cell 305.

To conduct a sensing operation on memory cell 305, a gate of the charge transfer device 320 may be biased to a first voltage. The first voltage may be equivalent to or may be based in part on a precharge voltage of the digit line 310 plus the threshold voltage of the charge transfer device 320. The capacitor 330 and the voltage source 332 may be configured to tune the first voltage at the gate of the charge transfer device 320 (e.g., bias the gate of the charge transfer device 320 from an initial voltage to a tuned voltage). The first voltage initially applied to the gate of the charge transfer device 320 may be based on the voltage at the node 360 during a compensation phase (e.g., a precharge voltage of the digit line 310 or a compensation voltage provided by the voltage source 335) and the threshold voltage of the charge transfer device 320. Later, the first voltage may be adjusted based on adjusting the voltage applied to the capacitor 330 coupled with the gate the gate of the charge transfer device 320. The first voltage applied to the gate of the charge transfer device 320 may result in the charge transfer device 320 being in an activated state based on a state stored on the memory cell 305. In some examples, the memory cell 305 may be discharged onto the digit line 310 after the first voltage is applied to the gate of the charge transfer device 320, including after changing the voltage applied to the capacitor 330 using the voltage source 332. Accordingly, by discharging the memory cell 305, the digit line 310 may be biased to a voltage (e.g., to a second voltage), which may be based on a logic state stored to the memory cell 305. For example, the digit line 310 may be biased to a different voltage if the memory cell 305 were to store a logic "1" state, then if the memory cell 305 were to store a logic "0" state. In some examples, the memory cell 305 may be configured to store three or more states. In such examples, the digit line may be biased to different voltages for each of those states.

In some examples, a second precharge voltage (e.g., from the voltage source 365) may be applied to the node 355 after the gate of the charge transfer device 320 is biased to the first voltage. The second precharge voltage may be applied to node 355 by activating the transistor 370 coupled with the voltage source 365. In some examples, the second precharge voltage is different than the first precharge voltage applied to the node 355. In some cases, the second precharge voltage is the same as the first precharge voltage applied to the node 355.

In some examples, after the memory cell 305 is discharged onto the digit line 310, the isolation device 315 may be activated to transfer a charge between the digit line 310 and the charge transfer device 320. Accordingly, after the resulting charge (e.g., the charge resulting from discharging the memory cell 305) is transferred by the charge transfer device 320 (e.g., when a voltage associated with the charge is received at the source of the charge transfer device 320), the isolation device 315 may be deactivated.

The charge transfer device 320 may transfer a varying amount of charge on the digit line 310 to the sense component 340 based on the state stored in the memory cell 305. Stated another way, when the memory cell 305 is discharged onto the digit line 310, a corresponding voltage (e.g., a second voltage) may be received at the source of the charge transfer device 320. The charge from the memory cell 305 may be transferred to the sense component 340 if the second voltage is less than the first voltage. Stated another way, the charge from the memory cell 305 may be transferred to the sense component if the voltage applied to the source of the charge transfer device 320 is less than the voltage applied to the gate of the charge transfer device 320. In some cases, because the charge across the digit line 310 may be associated with a logic state of the memory cell 305, the charge transfer device 320 may remain activated when a particular logic state is stored to the memory cell 305. For example, when the memory cell 305 stores a logic "0", the resulting charge may be transferred to the sense component 340. Conversely, in some examples, when a logic "1" is stored to the memory cell 305, the charge may not be transferred (e.g., the charge transfer device 320 may be deactivated).

In some cases, the first voltage may be applied to the gate of the charge transfer device 320 using a voltage source 335 rather than using the digit line 310 biased to the precharge voltage. In such cases, the digit line 310 may be isolated from the charge transfer device 320 while the first voltage is applied to the gate of the charge transfer device 320 (e.g., during the compensation phase). To bias the gate of the charge transfer device 320 to a first voltage, a precharge voltage (e.g., CT precharge) may be applied to node 355 by activating transistor 370 while the compensation device 325 is activated. After node 355 is at the desired precharge voltage, transistor 370 can be deactivated and then voltage source 335 may be coupled to the node 360 using the transistor 337 to apply a compensation voltage to the node 360.

In some examples, node 360 may be referred to as a node of the charge transfer device 320. The precharge voltage may be removed from the node 355 by deactivating the transistor 370. Accordingly, the node 355 and the gate of the charge transfer device 320 may begin to discharge to a value that may be about the compensation voltage plus the voltage threshold of the charge transfer device 320. The voltage source 335 may be configured to apply a voltage to node 360 concurrent with the charge of the memory cell 305 being coupled with the digit line 310 (e.g., the compensation phase occurs at the same time that the cell dump phase occurs). Using the voltage source 335 may reduce the amount of time taken for the read operation by allowing the two things to occur at once.

In some examples, the charge transfer device 320 may transfer the charge on the digit line 310 to the sense component 340. After the memory cell 305 is discharged onto the digit line 310, the isolation device 315 may be activated and a corresponding voltage may be received at the source of the charge transfer device 320. The resulting charge may be transferred to the sense component 340 if it is less than the voltage applied to the gate of the charge transfer device 320. Because the charge on the digit line 310 is associated with a logic state of the memory cell 305, the charge transfer device 320 may be activated when a particular logic state is stored to the memory cell 305. Thus, based on the logic state stored to the memory cell 305, the resulting charge of the digit line may be transferred to the sense component 340 by the charge transfer device 320.

In some examples, the charge transferred to the sense component 340 may be compared with a voltage on a reference line 350 during a sensing operation (e.g., during a read operation). When charge transfer device 320 transfers a charge from the digit line to the sense component 340, the node 355 may discharge more quickly or less quickly based on the state stored in the memory cell 305. In some examples, when charge transfer device 320 does not transfer a charge from the digit line to the sense component 340, the node 355 may discharge more slowly. Thus, sense component 340 may determine a logic state of the memory cell 305 based on comparing the voltage of node 355 to a voltage of the reference line 350 after a predetermined time.

Figure 4:
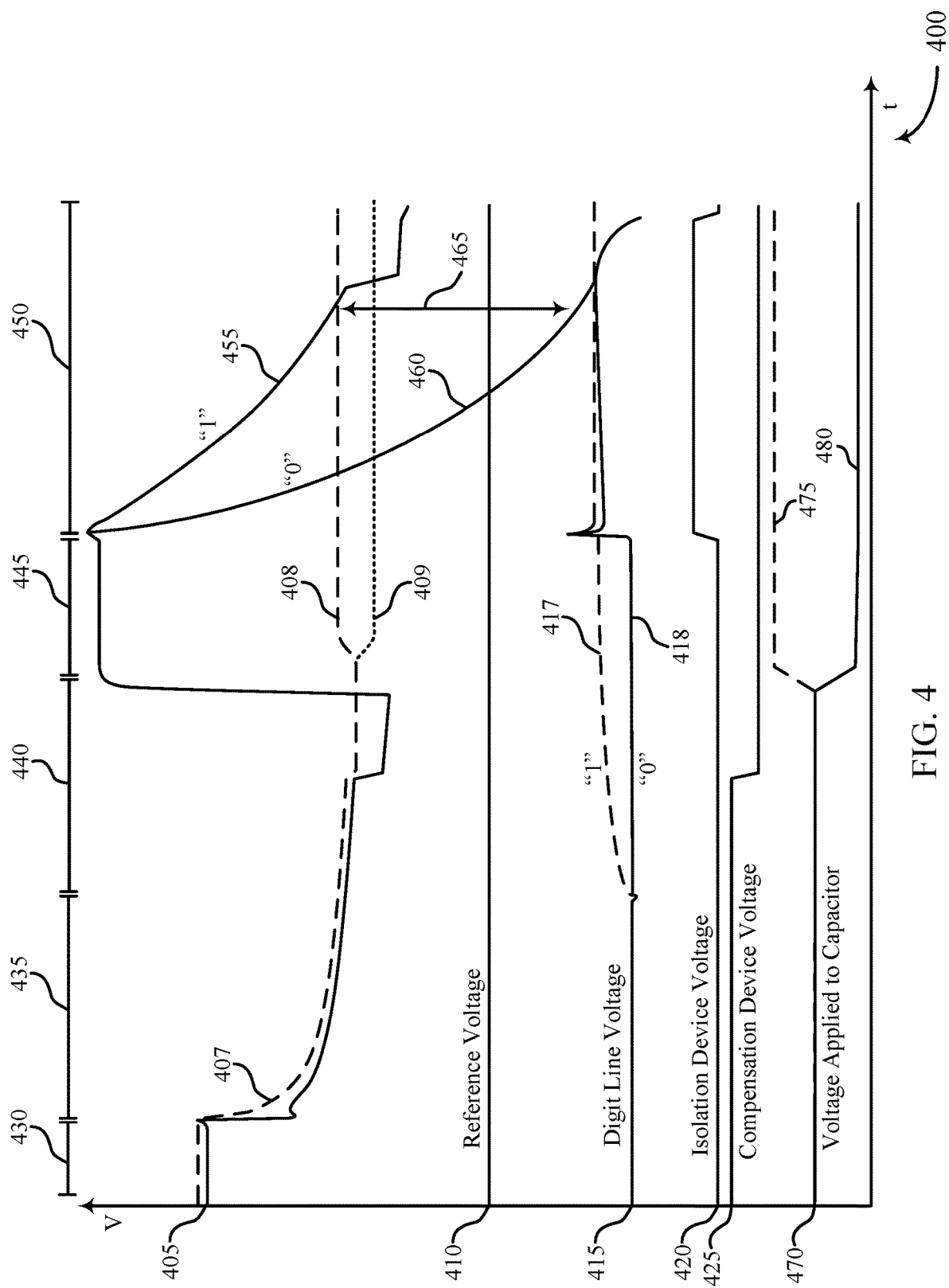
FIG. 4 illustrates an example of a timing diagram that supports tuning voltages in a read circuit in accordance with aspects of the present disclosure.

FIG. 4 illustrates an example of a timing diagram 400 that supports tuning voltages in a read circuit in accordance with aspects of the present disclosure. In some examples, timing diagram 400 may illustrate an operation of circuit 300 as described with reference to FIG. 3. Thus, timing diagram 400 may illustrate the operation of one or more components described above with reference to FIGS. 1, 2, and 3. For example, timing diagram 400 may illustrate voltage 405, which may result from operating charge transfer device 320 as described with reference to FIG. 3; reference voltage 410 (e.g., reference value), which may be an example of reference line 350 as described with reference to FIG. 3; digit line voltage 415, which may be an example of operating the digit line 310 as described with reference to FIG. 3; isolation device voltage 420 applied to the gate of the isolation device 315 as described with reference to FIG. 3; compensation device voltage 425 applied to the gate of the compensation device 325 as described with reference to FIG. 3; and the voltage 470 applied to the capacitor 330 as described with reference to FIG. 3. In some examples, voltage 405 may represent a voltage value of a node coupled with the charge transfer device (e.g., node 355 as described with reference to FIG. 3) and voltage 407 may represent a voltage on the gate of the charge transfer device. Voltage 405 and voltage 407 are shown as being slightly different voltages (e.g., at 430, 435, and 440) for illustrative purposes only, voltage 405 and voltage 407 may be the same voltage at 430, 435, and 440.

A read operation performed by a circuit (e.g., the circuit 300 as described with reference to FIG. 3) may be divided into different phases. A precharge phase may be used to precharge the node (e.g., the node 355 as described with reference to FIG. 3) and/or the digit line to their respective precharge voltages. A compensation phase may be used to set a gate voltage for the gate of the charge transfer device (e.g., the charge transfer device 320 as described with reference to FIG. 3). A cell dump phase may be used to dump the state (e.g., the charge) of the memory cell onto the digit line. In some examples, the compensation phase and the cell dump phase may be performed serially. In some examples, the compensation phase and the cell dump phase may be performed, at least in part, concurrently. After the compensation phase, the compensation device (e.g., the compensation device 325 as described with reference to FIG. 3) may be deactivated thereby causing the gate of the charge transfer device to float. After the compensation device is deactivated, the node may be precharged a second time before a sense phase of the read operation begins. With the gate voltage of the charge transfer device set and the memory cell having dumped its charge onto the digit line, the sense phase may begin. To begin the sense phase, the isolation device (e.g., the isolation device 315 as described with reference to FIG. 3) may be activated, thereby coupling the digit line with the charge transfer device. The charge transfer device may transfer a charge between the digit line and the node based on the state of the memory cell and/or the gate voltage applied to the gate of the charge transfer device. The sense component may be configured to sense a signal on the node after the charge is transferred. The state of the memory cell may be determined based on the signal sensed at the node.

At 430, a node coupled with the charge transfer device (e.g., charge transfer device 320 as described with reference to FIG. 3) may be precharged to first voltage. For example, the node may be precharged by a voltage source (e.g., voltage source 365) coupled with the node (e.g., node 355) and a compensation device (e.g., compensation device 325). In some examples, the node may be precharged to 1.5V. In some examples, the node may be precharged to a voltage value around or between 1.0V and 1.5V (e.g., 0.8 V, 0.9 V, 1.0 V, 1.1 V, 1.2 V, 1.3 V, 1.4 V, 1.5 V, 1.6 V, 1.7 V, and so forth). Accordingly, the voltage 405 and the voltage 407 be a same voltage (e.g., 1.5V). Additionally or alternatively, the reference voltage 410 may remain at a fixed voltage at 430.

The digit line voltage 415 may be biased to a fixed voltage value (e.g., a precharge voltage such as DVC2). The digit line may be precharged by coupling the digit line with a voltage source (e.g., voltage source 375). In some examples, the digit line may be coupled with the voltage source by activating a transistor (e.g., transistor 377). At 430, the compensation device may be activated by applying a compensation device voltage 425 to a gate of the compensation device. At 430, the isolation device may be deactivated by applying an isolation device voltage 420 to a gate of the isolation device.

At 435, a compensation operation may occur. The compensation operation may be used to set a gate voltage for the gate of the charge transfer device (e.g., the charge transfer device 320 as described with reference to FIG. 3). For example, to set the gate voltage, a transistor (e.g., the transistor 337 as described with reference to FIG. 3) may be activated, and the compensation voltage may be applied to the node (e.g., to node 360 as described with reference to FIG. 3). In some examples, an additional transistor (e.g., transistor 370 as described with reference to FIG. 3) may be deactivated at this time, preventing a voltage from being applied to the node coupled with the gate of the charge transfer device. At 435, the node coupled with the charge transfer device and the gate of the charge transfer device may begin to discharge (e.g., to a value based on a voltage applied to the node and the threshold voltage of the charge transfer device). In some examples, the compensation device may be activated for the node and the gate of the charge transfer device to be maintained at a similar voltage value.

At 440, a cell dump operation may begin, which may be used to dump the state (e.g., the charge) of the memory cell onto the digit line. Thus, at 440 a memory cell (e.g., memory cell 305 as described with reference to FIG. 3) may be discharged onto a digit line. Accordingly, at 440, the digit line voltage 415 may be biased to a second voltage by discharging the memory cell onto the digit line. A voltage of the digit line (e.g., the second voltage) may be based on the logic state stored to the memory cell. For example, digit line voltage 417 may represent a second voltage value based on the memory cell storing a logic "1" value. Additionally or alternatively, digit line voltage 418 may represent a logic "0" being discharged onto the digit line. In the example of FIG. 4, the compensation phase and the cell dump phase are performed, at least in part, concurrently. Thus, the operations occurring at 435 and 440 may occur concurrently and/or may partially overlap. In some examples, the compensation phase and the cell dump phase may be performed serially.

During the discharge operation, the voltage of the node coupled with the charge transfer device and the gate of the charge transfer device may continue to discharge as part of the compensation operation. As discussed above, this may be based in part on a voltage applied to the node and being subsequently removed (e.g., due to the node being precharged). In some examples, the transistor (e.g., the transistor 337 as described with reference to FIG. 3) that was previously activated to, in part, apply the compensation voltage may be deactivated. Thus, the compensation voltage may cease being applied to the node (e.g., to node 360 as described with reference to FIG. 3)

Sometime during 440, the compensation device may be deactivated thereby isolating the node from the gate of the charge transfer device. This may be illustrated where voltage 407 splits from voltage 405.

At 445, the gate voltage 407 may be identified after deactivating the compensation device. If the gate voltage 407 identified is different than a desired target voltage of the charge transfer device, a voltage 470 applied to a capacitor coupled with the gate of the charge transfer device (e.g., by voltage source 332 to the capacitor 330 as described with reference to FIG. 3) may be adjusted from a first voltage to a second voltage. For example, voltage 475 applied to the capacitor may represent increasing the voltage 475 applied to the capacitor. Additionally or alternatively, voltage 480 applied to the capacitor may represent decreasing the voltage 480 applied to the capacitor. The difference between the first voltage and the second voltage (i.e., the difference between voltage 470 and 475 and voltage 470 and voltage 480) may cause a corresponding difference in the gate voltage 407 of the charge transfer device. For example, the gate voltage 408 of the charge transfer device may represent a voltage value when voltage 475 may be applied to the capacitor. That is, increasing the voltage applied to the capacitor from voltage 470 to voltage 475 may cause the gate voltage 407 to increase to gate voltage 408. Additionally or alternatively, the gate voltage 409 may represent a voltage value when voltage 480 may be applied to the capacitor. That is, decreasing the voltage applied to the capacitor from voltage 470 to voltage 480 may cause the gate voltage 407 to decrease to gate voltage 409. In the example of FIG. 4, the voltage applied to the capacitor may be adjusted after deactivating the compensation device.

During 440, the voltage may be applied to the node (e.g., for a second time) during at least a portion of the time that the memory cell is discharging. This voltage may be used prepare the node for the sense phase of the read operation where a charge is transferred between the node and the digit line. In some cases, the voltage may be different than the first precharge voltage applied to the node during 430. In some cases, the voltage may be the same as the first precharge voltage applied to the node during 430. Later, during the sense phase, the node may discharge at different rates based on the state stored on the memory cell.

At 450, a sense operation may occur. The sense operation may begin when the isolation device voltage 420 goes high and the isolation device is activated thereby coupling the digit line with the charge transfer device. The charge transfer device may transfer a charge (e.g., a charge across the digit line) between a sense component (e.g., the node) and the digit line based on a voltage on the gate of the charge transfer device and a logic state stored to the memory cell. The charge transfer voltage 455 may represent the node discharging at a first rate, and the charge transfer voltage 460 may represent the node discharging at a second rate. In some examples, charge transfer voltage 455 may represent a logic "1" value stored on the memory cell, and the corresponding discharge rate may be due to the charge transfer device not transferring a charge from the digit line to the sense component. In some examples, charge transfer voltage 460 may represent a logic "0" value stored on the memory cell, and the corresponding discharge rate may be due to the charge transfer device transferring a charge from the digit line to the sense component. Stated another way, the node may discharge at a faster rate when the charge transfer device transfers a charge from the digit line to the sense component (e.g., when a logic "0" is stored to the memory cell). The rate of the discharge of the node during the sense phase may be based on a voltage difference between the voltage on the gate of the charge transfer device and the voltage on the source of the charge transfer device.

In some examples, the sense component may be fired at 465. The voltage of the node (e.g., charge transfer voltage 455, charge transfer voltage 460) may be compared with reference voltage 410. Thus, 465 may represent a sense operation occurring at a predetermined time after discharging the node, using a fixed reference voltage. As described above, by implementing a charge transfer device, the sensing window may be improved, thus resulting in a more accurate read operation. Additionally, by implementing a capacitor coupled to the gate of the charge transfer device for tuning the voltage applied to the gate of the charge transfer device, the gate voltage applied to the charge transfer device may match a target voltage more accurately (e.g., may more accurately compensate for a threshold voltage associated with the charge transfer device.

Figure 5:
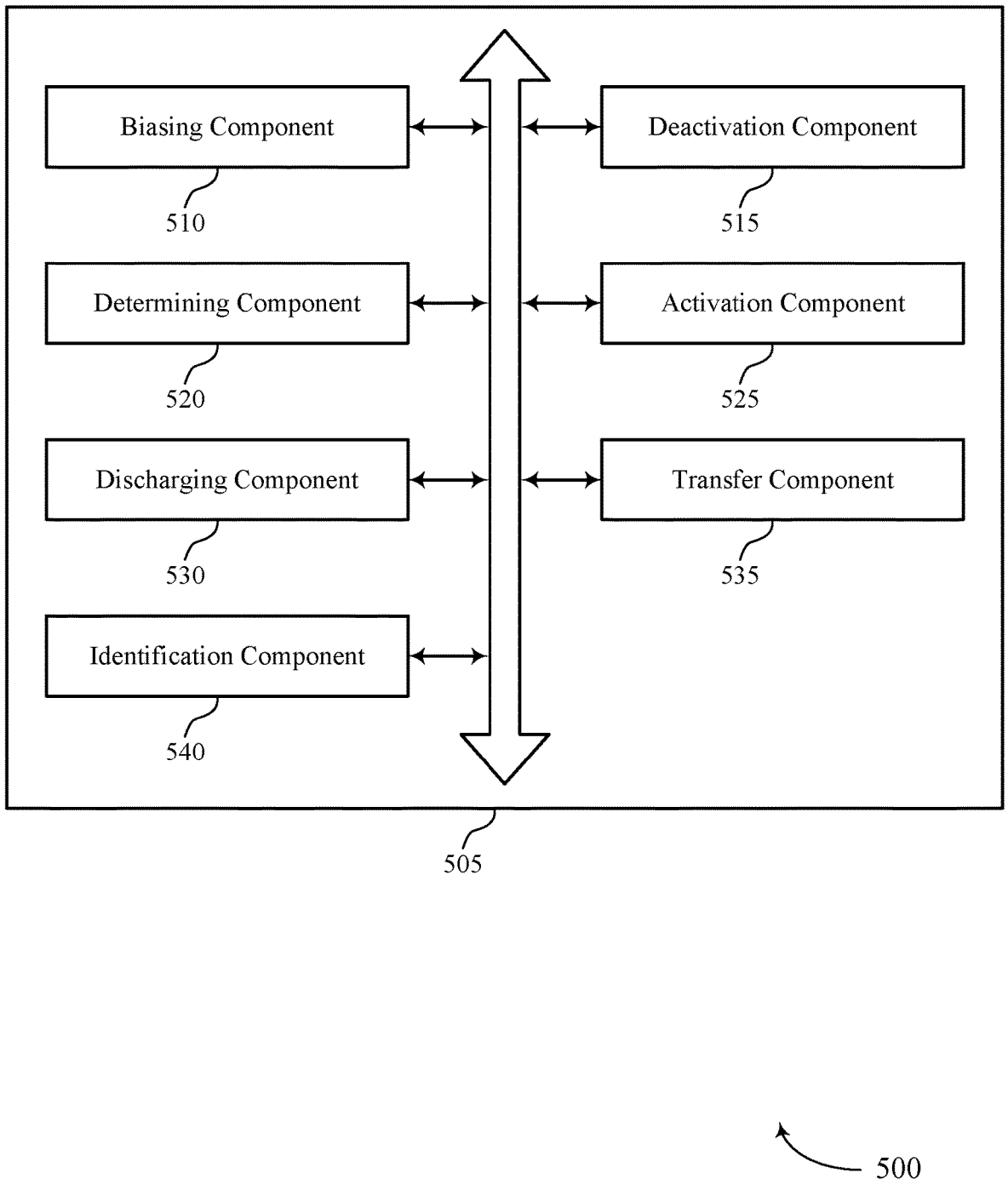
FIG. 5 illustrates a block diagram of a device that supports tuning voltages in a read circuit in accordance with aspects of the present disclosure.

FIG. 5 illustrates an example of a block diagram 500 of a charge transfer component 505 that supports tuning voltages in a read circuit in accordance with aspects of the present disclosure. The charge transfer component 505 may be an example of aspects of a controller (e.g., external memory controller 105, device memory controller 155, or local memory controller 165 as described with reference to FIG. 1). The charge transfer component 505 may include biasing component 510, deactivation component 515, determining component 520, activation component 525, discharging component 530, transfer component 535, and identification component 540. Each of these components may communicate, directly or indirectly, with one another (e.g., via one or more buses).

Biasing component 510 may bias a gate of a first transistor to a first voltage, the first transistor coupled with a digit line and a sense component and configured to transfer a charge between the digit line and the sense component during a read operation. In some instances, biasing component 510 may bias the gate of the first transistor to the first voltage based at least in part on a second transistor being activate. In some examples, biasing component 510 may bias the gate of the first transistor to a second voltage after deactivating the second transistor. In some cases, biasing the gate of the first transistor to the second voltage may include biasing component 510 biasing a first plate of a capacitor from a third voltage to a fourth voltage, the capacitor having a second plate coupled with the gate of the first transistor. In some cases, biasing component 510 may bias the first plate to the fourth voltage after the second transistor has been deactivated and before a third transistor has been activated. In some instances, the second voltage may be based at least in part on a difference between the third voltage to the fourth voltage. In some examples, the fourth voltage may be greater than the third voltage and the second voltage may be greater than the first voltage. In some cases, biasing the gate of the first transistor to the second voltage may match a target voltage for the first transistor more accurately (e.g., may compensate for a threshold voltage variation associated with the first transistor).

Deactivation component 515 may deactivate the second transistor to isolate the gate of the first transistor from the sense component. In some cases, deactivation component 515 may deactivate the second transistor after the gate of the first transistor is biased to the first voltage. In some examples, deactivating the second transistor may cause the gate of the first transistor to float. In some instances, deactivation component 515 may deactivate the third transistor to isolate the first transistor from the digit line. In some cases, deactivation component 515 may deactivate the third transistor after the gate of the first transistor has been biased to the first voltage. In some instances, deactivation component 515 may deactivate the second transistor after deactivating the third transistor.

Determining component 520 may determine a logic state of a memory cell at the sense component based at least in part on the gate of the first transistor being biased to the second voltage.

Activation component 525 may activate the third transistor to couple the first transistor with the digit line. In some instances, activation component 525 may activate the third transistor after the first plate of the capacitor has been biased to the fourth voltage. In some examples, activation component 525 may activate the third transistor based at least in part on the first transistor being biased to the second voltage. In some cases, activation component 525 may activate the second transistor coupled to the sense component and the first transistor before biasing the gate of the first transistor to the first voltage.

Discharging component 530 may bias the digit line to a fifth voltage by discharging the memory cell onto the digit line after biasing the gate of the first transistor to the second voltage. Transfer component 535 may transfer by the first transistor, the charge between the digit line and the sense component based at least in part on the fifth voltage being less than the second voltage of the gate of the first transistor. Identification component 540 may identify the first voltage of the gate of the first transistor before biasing the gate of the first transistor to the second voltage, wherein the gate of the first transistor is biased to the second voltage based at least in part on identifying the first voltage of the gate of the first transistor.

Figure 6:
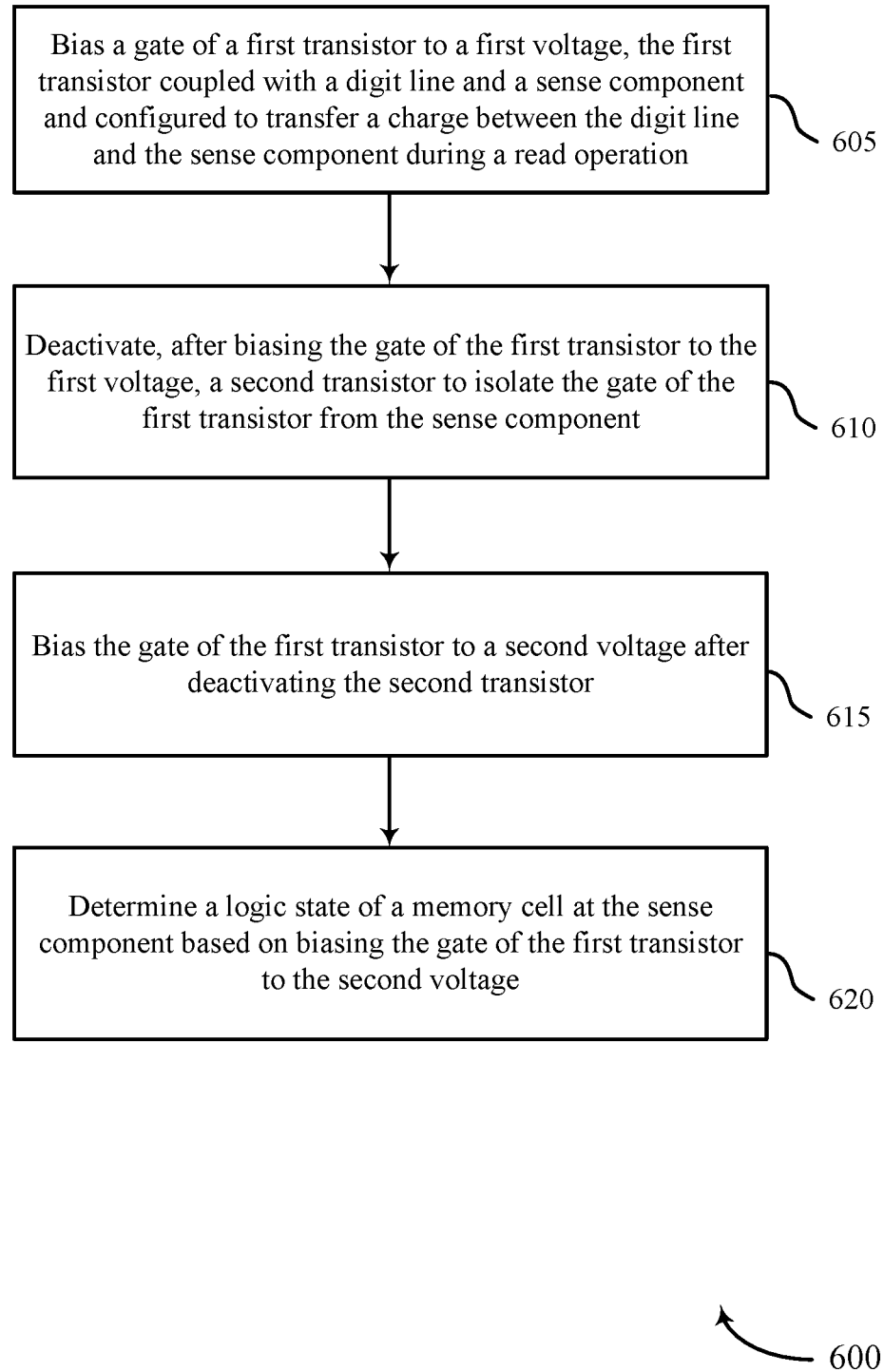
FIGS. 6 and 7 show flowcharts illustrating a method or methods that support tuning voltages in a read circuit in accordance with aspects of the present disclosure.

FIG. 6 shows a flowchart illustrating a method 600 that supports tuning voltages in a read circuit in accordance with aspects of the present disclosure. The operations of method 600 may be implemented by a controller or its components as described herein. For example, the operations of method 600 may be performed by an external memory controller 105, a device memory controller 155, a local memory controller 165, or a combination thereof as described with reference to FIG. 1. In some examples, a controller may execute a set of instructions to control the functional elements of the memory device to perform the functions described below. Additionally or alternatively, a controller may perform aspects of the functions described below using special-purpose hardware.

At 605, the gate of a first transistor may be biased to a first voltage. In some examples, the first transistor may be coupled with a digit line and a sense component and configured to transfer a charge between the digit line and the sense component during a read operation. In some examples, aspects of the operations of 605 may be performed by a biasing component as described with reference to FIG. 5.

At 610, a second transistor may be deactivated to isolate the gate of the first transistor from the sense component. In some cases, the second transistor may be deactivated after biasing the gate of the first transistor to the first voltage. In some examples, aspects of the operations of 610 may be performed by a deactivation component as described with reference to FIG. 5.

At 615, the gate of the first transistor may be biased to a second voltage after deactivating the second transistor. In some examples, aspects of the operations of 615 may be performed by a biasing component as described with reference to FIG. 5.

At 620, a logic state of a memory cell may be determined at the sense component based on biasing the gate of the first transistor to the second voltage. In some examples, aspects of the operations of 620 may be performed by a determining component as described with reference to FIG. 5.

Figure 7:
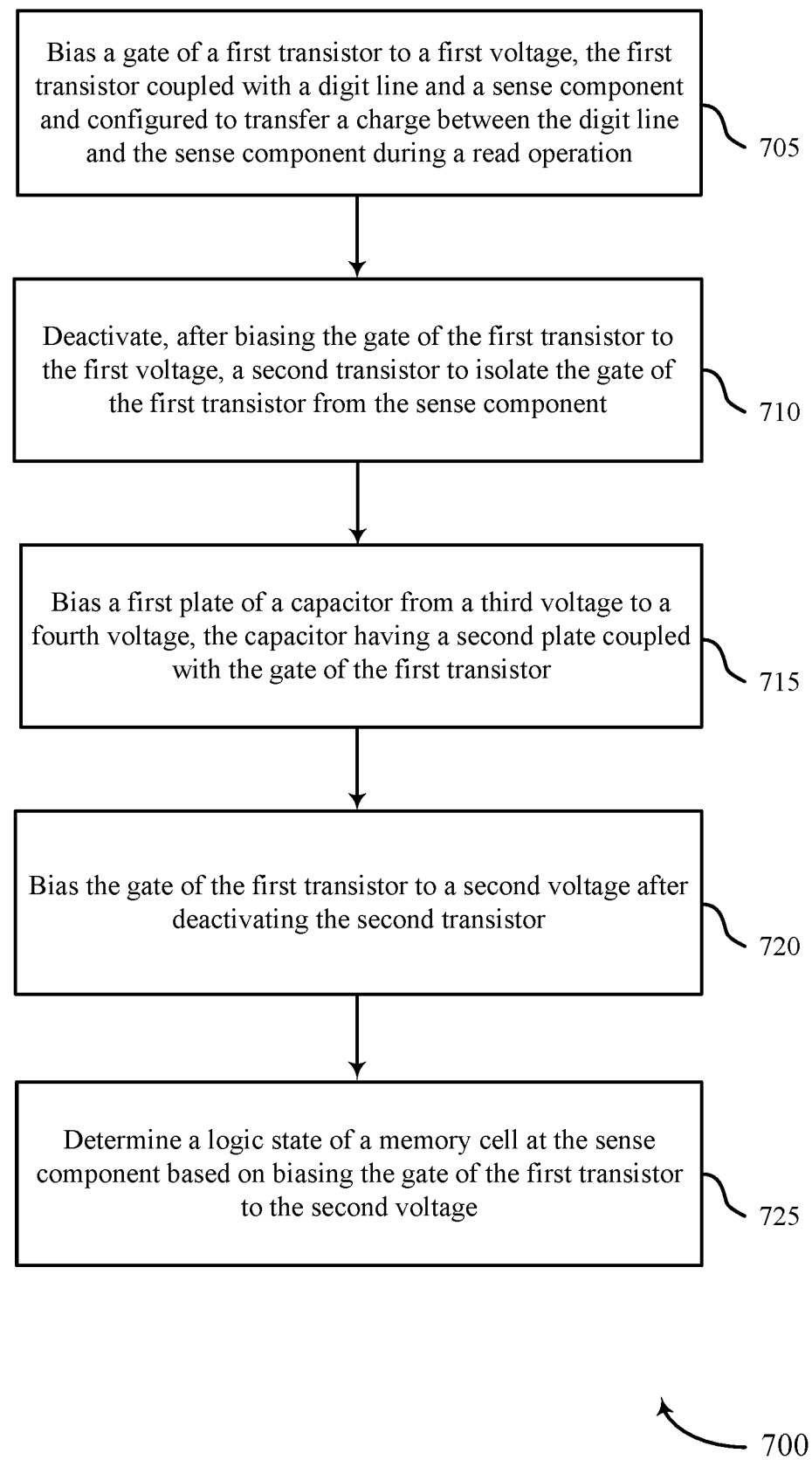

FIG. 7 shows a flowchart illustrating a method 700 that supports tuning voltages in a read circuit in accordance with aspects of the present disclosure. The operations of method 700 may be implemented by a controller or its components as described herein. For example, the operations of method 700 may be performed by an external memory controller 105, a device memory controller 155, a local memory controller 165, or a combination thereof as described with reference to FIG. 1. In some examples, a controller may execute a set of instructions to control the functional elements of the memory device to perform the functions described below. Additionally or alternatively, a controller may perform aspects of the functions described below using special-purpose hardware.

At 705, a gate of a first transistor may be biased to a first voltage. In some cases, the first transistor may be coupled with a digit line and a sense component and configured to transfer a charge between the digit line and the sense component during a read operation. In some examples, aspects of the operations of 705 may be performed by a biasing component as described with reference to FIG. 5.

At 710, a second transistor may be deactivated to isolate the gate of the first transistor from the sense component. In some instances, the second transistor may be deactivated after biasing the gate of the first transistor to the first voltage. In some examples, aspects of the operations of 710 may be performed by a deactivation component as described with reference to FIG. 5.

At 715, a first plate of a capacitor may be biased from a third voltage to a fourth voltage. The capacitor may have a second plate coupled with the gate of the first transistor. In some examples, aspects of the operations of 715 may be performed by a biasing component as described with reference to FIG. 5.

At 720, the gate of the first transistor may be biased to a second voltage after deactivating the second transistor. In some examples, aspects of the operations of 720 may be performed by a biasing component as described with reference to FIG. 5.

At 725, a logic state of a memory cell may be determined at the sense component based on biasing the gate of the first transistor to the second voltage. In some examples, aspects of the operations of 725 may be performed by a determining component as described with reference to FIG. 5.

A method is described. In some examples, the method may include biasing a gate of a first transistor to a first voltage, the first transistor coupled with a digit line and a sense component and configured to transfer a charge between the digit line and the sense component during a read operation. In some instances, the method may include deactivating, after biasing the gate of the first transistor to the first voltage, a second transistor to isolate the gate of the first transistor from the sense component, biasing the gate of the first transistor to a second voltage after deactivating the second transistor, and determining a logic state of a memory cell at the sense component based on biasing the gate of the first transistor to the second voltage.

In some examples, the method may include biasing the gate of the first transistor to the second voltage further may include biasing a first plate of a capacitor from a third voltage to a fourth voltage, the capacitor having a second plate coupled with the gate of the first transistor. In some examples, the method may include activating a third transistor to couple the first transistor with the digit line, where biasing the first plate of the capacitor to the fourth voltage occurs after deactivating the second transistor and before activating the third transistor. In some examples, the second voltage may be based on a difference between the third voltage to the fourth voltage. In some examples, the second voltage may be based on a difference between the third voltage to the fourth voltage. In some examples, the fourth voltage may be greater than the third voltage and the second voltage may be greater than the first voltage. In some examples of the method, deactivating the second transistor causes the gate of the first transistor to float. In some cases, biasing the gate of the first transistor to the second voltage compensates for a threshold voltage variation associated with the first transistor.

In some examples, the method may include biasing the digit line to a fifth voltage by discharging the memory cell onto the digit line after biasing the gate of the first transistor to the second voltage, activating a third transistor to couple the first transistor with the digit line, the third transistor being activated based on biasing the gate of the first transistor to the second voltage and transferring, by the first transistor, the charge between the digit line and the sense component based on the fifth voltage being less than the second voltage of the gate of the first transistor. In some cases, the method may include deactivating, after biasing the gate of the first transistor to the first voltage, the third transistor to isolate the first transistor from the digit line, where deactivating the second transistor occurs after deactivating the third transistor. In some instances, the method may include activating the second transistor coupled to the sense component and the first transistor before biasing the gate of the first transistor to the first voltage, where biasing the gate of the first transistor to the first voltage may be based on activating the second transistor. In some examples, the method may include identifying the first voltage of the gate of the first transistor before biasing the gate of the first transistor to the second voltage, where the gate of the first transistor may be biased to the second voltage based on identifying the first voltage of the gate of the first transistor. In some cases, the memory cell may be configured to store three or more states.

An apparatus is described. The apparatus may include means for biasing a gate of a first transistor to a first voltage, the first transistor coupled with a digit line and a sense component and configured to transfer a charge between the digit line and the sense component during a read operation, deactivating, after biasing the gate of the first transistor to the first voltage, a second transistor to isolate the gate of the first transistor from the sense component, biasing the gate of the first transistor to a second voltage after deactivating the second transistor, and determining a logic state of a memory cell at the sense component based on biasing the gate of the first transistor to the second voltage.

In some examples, the means for biasing the gate of the first transistor to the second voltage may include means for biasing a first plate of a capacitor from a third voltage to a fourth voltage, the capacitor having a second plate coupled with the gate of the first transistor. In some examples, means for biasing the gate of the first transistor to the second voltage further may include means for activating a third transistor to couple the first transistor with the digit line, where biasing the first plate of the capacitor to the fourth voltage occurs after deactivating the second transistor and before activating the third transistor. In some examples, the second voltage may be based on a difference between the third voltage to the fourth voltage. In some cases, the fourth voltage may be greater than the third voltage and the second voltage may be greater than the first voltage. In some instances, deactivating the second transistor causes the gate of the first transistor to float. In some examples, biasing the gate of the first transistor to the second voltage compensates for a threshold voltage variation associated with the first transistor.

In some examples, the apparatus may support means for biasing the digit line to a fifth voltage by discharging the memory cell onto the digit line after biasing the gate of the first transistor to the second voltage, activating a third transistor to couple the first transistor with the digit line, the third transistor being activated based on biasing the gate of the first transistor to the second voltage and transferring, by the first transistor, the charge between the digit line and the sense component based on the fifth voltage being less than the second voltage of the gate of the first transistor. In some examples, the apparatus may support means for deactivating, after biasing the gate of the first transistor to the first voltage, the third transistor to isolate the first transistor from the digit line, where deactivating the second transistor occurs after deactivating the third transistor. In some cases, the apparatus may support means for activating the second transistor coupled to the sense component and the first transistor before biasing the gate of the first transistor to the first voltage, where biasing the gate of the first transistor to the first voltage may be based on activating the second transistor. In some instances, the apparatus may support means for identifying the first voltage of the gate of the first transistor before biasing the gate of the first transistor to the second voltage, where the gate of the first transistor may be biased to the second voltage based on identifying the first voltage of the gate of the first transistor. In some examples, the memory cell may be configured to store three or more states.

An apparatus is described. The apparatus may include a memory cell coupled with a digit line, a sense component including a node, a first transistor coupled with the sense component and configured to transfer charge between the digit line and the node of the sense component during a read operation, a second transistor coupled with a gate of the first transistor and the sense component, the second transistor configured to apply a first voltage to the gate of the first transistor that compensates for a threshold voltage associated with the first transistor, and a capacitor coupled with the gate of the first transistor and configured to bias the gate of the first transistor to a second voltage different than the first voltage.

In some examples of the apparatus, the capacitor includes a first plate coupled with a voltage source and a second plate coupled with the gate of the first transistor. In some cases, the apparatus may include a voltage source coupled with the capacitor and configured to bias a first plate of the capacitor from a third voltage to a fourth voltage, where the capacitor may be configured to bias the gate of the first transistor from the first voltage to the second voltage based on biasing the first plate of the capacitor from the third voltage to the fourth voltage. In some examples the apparatus may include a third transistor coupled with the digit line and the first transistor, the third transistor configured to selectively couple the digit line with the first transistor during the read operation. In some examples of the apparatus, the second transistor may be configured as a diode. In some instances of the apparatus, the gate of the first transistor may be charged to a precharge voltage to compensate for the threshold voltage of the first transistor. In some cases of the apparatus, the memory cell may be configured to store three or more states.

An apparatus is described. The apparatus may include a memory cell coupled with a digit line, a sense component, a first transistor coupled with the digit line and the sense component, a second transistor coupled with a gate of the first transistor and the sense component, a controller coupled with the memory cell. In some cases, the controller may be configured to isolate the gate of the first transistor from the sense component by deactivating, after biasing the gate of the first transistor to the first voltage, the second transistor. In some examples, the controller may be configured to bias the gate of the first transistor to a second voltage after isolating the gate of the first transistor from the sense component. In some examples, the controller may be configured to determine a logic state of the memory cell at the sense component based on biasing the gate of the first transistor to the second voltage.

In some examples of the apparatus, the capacitor may include a first plate and a second plate that may be coupled with the gate of the first transistor. In some cases, the controller may be configured to bias the first plate of the capacitor from a third voltage to a fourth voltage, where biasing the gate of the first transistor to the second voltage may be based at least in part on biasing the first plate of the capacitor to the fourth voltage. In some examples, the apparatus may include a third transistor coupled with the first transistor and the digit line. In some cases, the controller may be configured to activate the third transistor, where biasing the first plate of the capacitor to the fourth voltage occurs after deactivating the second transistor and before activating the third transistor. In some examples, the second voltage may be based on a difference between the third voltage to the fourth voltage. In some cases, the fourth voltage may be different than the third voltage and the second voltage may be different than the first voltage. In some instances, deactivating the second transistor causes the gate of the first transistor to float.

It should be noted that the methods described above describe possible implementations, and that the operations and the steps may be rearranged or otherwise modified and that other implementations are possible. Further, aspects from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" used herein refers to a stratum or sheet of a geometrical structure. each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
biasing a gate of a first transistor to a first voltage, the first transistor coupled with a digit line and a sense component and configured to transfer a charge between the digit line and the sense component during a read operation;
deactivating, after biasing the gate of the first transistor to the first voltage, a second transistor to isolate the gate of the first transistor from the sense component;
biasing the gate of the first transistor to a second voltage after deactivating the second transistor; and
determining a logic state of a memory cell at the sense component based at least in part on biasing the gate of the first transistor to the second voltage.

2. The method of claim 1, wherein biasing the gate of the first transistor to the second voltage further comprises:
biasing a first plate of a capacitor from a third voltage to a fourth voltage, the capacitor having a second plate coupled with the gate of the first transistor.

3. The method of claim 2, further comprising:
activating a third transistor to couple the first transistor with the digit line, wherein biasing the first plate of the capacitor to the fourth voltage occurs after deactivating the second transistor and before activating the third transistor.

4. The method of claim 2, wherein the second voltage is based at least in part on a difference between the third voltage to the fourth voltage.

5. The method of claim 2, wherein:
the fourth voltage is greater than the third voltage; and
the second voltage is greater than the first voltage.

6. The method of claim 1, wherein:
deactivating the second transistor causes the gate of the first transistor to float.

7. The method of claim 1, wherein:
biasing the gate of the first transistor to the second voltage compensates for a threshold voltage variation associated with the first transistor.

8. The method of claim 1, further comprising:
biasing the digit line to a fifth voltage by discharging the memory cell onto the digit line after biasing the gate of the first transistor to the second voltage;
activating a third transistor to couple the first transistor with the digit line, the third transistor being activated based at least in part on biasing the gate of the first transistor to the second voltage; and
transferring, by the first transistor, the charge between the digit line and the sense component based at least in part on the fifth voltage being less than the second voltage of the gate of the first transistor.

9. The method of claim 8, further comprising:
deactivating, after biasing the gate of the first transistor to the first voltage, the third transistor to isolate the first transistor from the digit line, wherein deactivating the second transistor occurs after deactivating the third transistor.

10. The method of claim 1, further comprising:
activating the second transistor coupled to the sense component and the first transistor before biasing the gate of the first transistor to the first voltage, wherein biasing the gate of the first transistor to the first voltage is based at least in part on activating the second transistor.

11. The method of claim 1, further comprising:
identifying the first voltage of the gate of the first transistor before biasing the gate of the first transistor to the second voltage, wherein the gate of the first transistor is biased to the second voltage based at least in part on identifying the first voltage of the gate of the first transistor.

12. The method of claim 1, wherein the memory cell is configured to store three or more states.

13. An apparatus, comprising:
a memory cell coupled with a digit line;
a sense component comprising a node;
a first transistor coupled with the sense component and configured to transfer charge between the digit line and the node of the sense component during a read operation;
a second transistor coupled with a gate of the first transistor and the sense component, the second transistor configured to apply a first voltage to the gate of the first transistor that compensates for a threshold voltage associated with the first transistor; and
a capacitor coupled with the gate of the first transistor and configured to bias the gate of the first transistor to a second voltage different than the first voltage.

14. The apparatus of claim 13, wherein the capacitor comprises a first plate coupled with a voltage source and a second plate coupled with the gate of the first transistor.

15. The apparatus of claim 13, further comprising:
a voltage source coupled with the capacitor and configured to bias a first plate of the capacitor from a third voltage to a fourth voltage, wherein the capacitor is configured to bias the gate of the first transistor from the first voltage to the second voltage based at least in part on biasing the first plate of the capacitor from the third voltage to the fourth voltage.

16. The apparatus of claim 13, further comprising:
a third transistor coupled with the digit line and the first transistor, the third transistor configured to selectively couple the digit line with the first transistor during the read operation.

17. The apparatus of claim 13, wherein the second transistor is configured as a diode.

18. The apparatus of claim 13, wherein the gate of the first transistor is charged to a precharge voltage to compensate for the threshold voltage of the first transistor.

19. The apparatus of claim 13, wherein the memory cell is configured to store three or more states.

20. An apparatus, comprising:
a memory cell coupled with a digit line;
a sense component;
a first transistor coupled with the digit line and the sense component;
a second transistor coupled with a gate of the first transistor and the sense component;
a controller coupled with the memory cell, the controller configured to;
bias the gate of the first transistor to a first voltage;
isolate the gate of the first transistor from the sense component by deactivating, after biasing the gate of the first transistor to the first voltage, the second transistor;
bias the gate of the first transistor to a second voltage after isolating the gate of the first transistor from the sense component; and
determine a logic state of the memory cell at the sense component based at least in part on biasing the gate of the first transistor to the second voltage.

21. The apparatus of claim 20, further comprising:
a capacitor comprising first plate and a second plate that is coupled with the gate of the first transistor, wherein the controller is configured to:
bias the first plate of the capacitor from a third voltage to a fourth voltage, wherein biasing the gate of the first transistor to the second voltage is based at least in part on biasing the first plate of the capacitor to the fourth voltage.

22. The apparatus of claim 21, further comprising:
a third transistor coupled with the first transistor and the digit line, wherein the controller is configured to:
activate the third transistor, wherein biasing the first plate of the capacitor to the fourth voltage occurs after deactivating the second transistor and before activating the third transistor.

23. The apparatus of claim 21, wherein the second voltage is based at least in part on a difference between the third voltage to the fourth voltage.

24. The apparatus of claim 21, wherein:
the fourth voltage is different than the third voltage; and
the second voltage is different than the first voltage.

25. The apparatus of claim 20, wherein:
deactivating the second transistor causes the gate of the first transistor to float.

* * * * *